US008352842B2

(12) United States Patent  (10) Patent No.: US 8,352,842 B2
Jones, Jr.  (45) Date of Patent: Jan. 8, 2013

(54) DETERMINING CONTRIBUTION OF BURST NOISE TO DATA ERRORS

(75) Inventor: Richard Earl Jones, Jr., Plainfield, IN (US)

(73) Assignee: Acterna LLC, Germantown, MD (US)

( * ) Notice: Subject to any disclaimer, the term of this patent is extended or adjusted under 35 U.S.C. 154(b) by 797 days.

(21) Appl. No.: 12/485,281

(22) Filed: Jun. 16, 2009

(65) Prior Publication Data

US 2009/0319838 A1  Dec. 24, 2009

Related U.S. Application Data

(60) Provisional application No. 61/073,446, filed on Jun. 18, 2008.

(51) Int. Cl.
 *H03M 13/00* (2006.01)
(52) U.S. Cl. .................... 714/781; 714/786; 714/780
(58) Field of Classification Search ............ 714/781, 714/786, 704, 780, 756, 701, 755
See application file for complete search history.

(56) References Cited

U.S. PATENT DOCUMENTS

| 4,559,625 A * | 12/1985 | Berlekamp et al. ........... 714/701 |
| 5,392,299 A * | 2/1995 | Rhines et al. ................. 714/756 |
| 5,511,096 A | 4/1996 | Huang et al. .................. 375/265 |
| 5,519,734 A | 5/1996 | Ben-Efraim .................. 375/341 |
| 5,592,492 A | 1/1997 | Ben-Efraim et al. .......... 714/702 |
| 5,745,497 A | 4/1998 | Ben-Efraim et al. .......... 714/702 |
| 5,761,249 A | 6/1998 | Ben-Efraim .................. 375/341 |
| 5,875,199 A * | 2/1999 | Luthi ............................ 714/780 |
| 5,942,003 A | 8/1999 | Ivry .............................. 714/762 |
| 6,662,332 B1 | 12/2003 | Kimmitt ....................... 714/762 |
| 6,742,155 B2 | 5/2004 | Bengough .................... 714/752 |
| 6,944,206 B1 * | 9/2005 | Dent ............................ 375/144 |
| 2006/0053004 A1 * | 3/2006 | Ceperkovic et al. ........ 704/221 |
| 2006/0120183 A1 * | 6/2006 | Hong ............................ 365/194 |
| 2009/0052541 A1 * | 2/2009 | Kang et al. ............... 375/240.24 |

OTHER PUBLICATIONS

International Telecommunication Union, "Series J: Transmission of Television, Sound Programme and Other Multimedia: Digital transmission of television signals; Digital multi-programme systems for television, sound and data services for cable distribution", Telecommunication Standardization Sector of ITU, ITU-T Recommendation J.83, Apr. 1997.

* cited by examiner

*Primary Examiner* — Fritz Alphonse
(74) *Attorney, Agent, or Firm* — Matthew A. Pequignot; Pequignot + Myers LLC

(57) ABSTRACT

A method for determining a contribution of burst noise to a bit error rate in a digital system for reception of an interleaved forward error correction-enabled digital symbol stream is described. The method is based on identifying errored symbols at a decoding stage, determining their positions in the interleaved stream, and performing a windowing operation such that the errored symbols located within the window in the interleaved stream are designated as burst errored symbols. A corresponding digital receiver and a digital transmission system are also disclosed.

20 Claims, 8 Drawing Sheets

DETERMINING CONTRIBUTION OF BURST NOISE TO DATA ERRORS

CROSS-REFERENCE TO RELATED APPLICATIONS

The present invention claims priority from U.S. provisional patent application No. 61/073,446, filed Jun. 1, 2009, which is incorporated herein by reference.

TECHNICAL FIELD

The present invention relates to digital data streams, and in particular to determining a contribution of a burst noise to a digital data stream reception errors.

BACKGROUND OF THE INVENTION

Development of digital technologies for recording and playing back images and sound, and for transmitting these images or sound in a free space or over a cable, is now reaching a point at which it is evident that they offer significant advantages in comparison with conventional analogue techniques. Vision and sound quality, spectrum and power efficiency, service flexibility, multimedia convergence and potentially lower equipment costs are some of the advantages. Use of digitized signals for delivery of video and audio services to individual subscribers is continually growing, and has already become a dominant form of distribution in many parts of the world.

Digital systems for broadcasting, receiving, recording, or playing back digital video or audio data frequently use an error correction technique called forward error correction (FEC). In an FEC technique, a redundancy information is encoded into digital data according to a pre-defined algorithm, so that data errors can be corrected upon reception, without having to request a repeated transmission or playback. Such a request may be impractical or impossible to fulfill in a digital one-way broadcasting system or in a digital playback system.

It is common for the encoded symbols of the data stream to be purposely shuffled, or interleaved, using a pre-determined interleaving pattern. On the receiving end, the symbols are de-shuffled, or "deinterleaved" using the same pattern in reverse, and then decoded to recover information lost due to errored symbols. The interleaving technique is utilized to protect a digital system against so called burst errors, or errors caused by a sudden burst of noise impacting two or more neighboring symbols in a digital data stream. Without it, an FEC decoder might not be able to recover all the lost information caused by the noise burst due to, for example, a scratch on a DVD being played, or due to an electromagnetic pulse induced in a coaxial community antenna television (CATV) cable plant. A comparison can be drawn to a case of comprehending a corrupted printed word in a sentence. When one letter of the word is corrupted or missing, the entire word, in most cases, can be comprehended. When, however, two or more letters are missing in the word, the entire word may become incomprehensible to a reader.

Even though the interleaving technique is successfully used for improving the level of tolerance of a digital communication link to burst noise, it has limitations related to the circuit complexity, amount of memory required for interleaving and deinterleaving, as well as to a latency of signal reception due to interleaving and deinterleaving. It is prudent to implement just as much interleaving as required to effectively suppress a bit error rate (BER) increase due to a burst noise that is typical for the system in question. However, in modern digital systems, the BER depends on a large number of factors, including burst and random noise, signal strength, modulation type, encoding parameters selection, and so on. As a result, the contribution of burst noise to BER cannot be easily deduced. Furthermore, the burst noise can change with time, which may require a periodic re-optimization of the system parameters. A device and method for determining a contribution of burst noise to a BER in a digital system is therefore highly desirable.

Typical prior-art test instruments for measurement of the BER of a CATV quadrature amplitude modulated (QAM) signal use information from a Reed-Solomon (RS) decoder to calculate the so called pre- and post-FEC BER. There is no distinction made between bit errors caused by random noise and bit errors caused by burst noise.

In U.S. Pat. No. 6,662,332 by Kimmitt, which is incorporated herein by reference, a method and apparatus for detecting errors in serially transmitted digital data is taught, in which encoding and interleaving is employed. In one embodiment, Kimmitt teaches increasing interleaving depth when detected BER exceeds a threshold value. However, the apparatus of Kimmitt does not discriminate between BER increase caused by random and burst errors. Consequently, when the errors are random and not burst errors, increasing interleaving depth as described by Kimmitt does not result in BER reduction.

In U.S. Pat. No. 5,942,003 by Ivry, which is incorporated herein by reference, a burst error detector for lowering a receiver BER is taught. In a detector of Ivry, a deviation of detected symbol complex amplitude from a value corresponding to a recognizable symbol is measured at a demodulator stage of the receiver. Based on the measured magnitude of the deviation, an error burst detection circuit evaluates probability that a symbol is received in error due to burst noise. This information, together with location of the errored bits in the data stream received, is sent through a de-interleaver to a block RS decoder. The RS decoder uses this additional information to increase the number of detectable and correctable bits. The apparatus of Ivry is capable of effectively doubling the number of correctable symbols as compared to a conventional RS decoding based FEC technique. Disadvantageously, the apparatus of Ivry is considerably more complex than a conventional RS decoder, and requires fine tuning of the demodulator electronics. In addition, the apparatus of Ivry is constructed to detect a single symbol error, not a burst of errors.

The methods of the prior art either do not distinguish between random and burst noise, or require complex electronics to detect reception errors caused specifically by burst noise. Accordingly, it is a goal of the present invention to provide a method and a simple system for determining a contribution of burst noise and random noise to the errors of reception of a digital data stream.

SUMMARY OF THE INVENTION

As noted above, the symbols in a FEC encoded digital data stream are interleaved, so that the burst noise contribution to symbol errors cannot be easily deduced. However, the interleaving sequence is pre-determined for most systems and, therefore, the indices of errored symbols indicating their position in the interleaved data stream can be calculated. Once the indices are calculated, errors due to burst noise can be identified.

Accordingly, there is provided a method for determining a contribution of burst noise to errors of reception of an interleaved digital signal stream, comprising:
(a) deinterleaving the interleaved digital signal stream;
(b) detecting first and second symbol errors in the digital signal stream deinterleaved in step
(a), wherein the first and the second symbol errors correspond to first and second errored symbols, respectively; and
(c) determining whether the first and the second errored symbols are due to burst noise, by comparing a separation between the first and the second errored symbols in the interleaved digital signal stream to a pre-determined threshold value.

In accordance with another aspect of the invention there is further provided a method for determining a burst bit error rate in a digital transmission link for transmitting a stream of interleaved encoded symbols, the method comprising:
(a) deinterleaving the stream of interleaved encoded symbols;
(b) decoding the deinterleaved stream of symbols, so as to detect errored symbols;
(c) determining position of the errored symbols in the stream of interleaved encoded symbols;
(d) selecting, out of the errored symbols detected, burst errored symbols, which are closer to each other in the stream of interleaved encoded symbols than a pre-defined threshold symbol-to-symbol distance;
(e) calculating a total number of burst errored symbols; and
(f) determining the burst bit error rate based on the total number of the burst errored symbols calculated in step (e).

In accordance with another aspect of the invention there is further provided a receiver for receiving a stream of interleaved encoded digital symbols, comprising:
a deinterleaver for deinterleaving the interleaved encoded digital symbols;
a decoder coupled to the deinterleaver, for decoding the encoded digital symbols, so that an errored digital symbol is detectable;
a translator coupled to the decoder, for creating an index of interleaved errored digital symbols; and
a processing unit suitably programmed to determine the burst bit error rate according to an above stated method.

In accordance with another aspect of the invention there is further provided a transmission system for transmitting digital symbols between first and second locations, wherein the transmission system has an adjustable interleaving depth, the transmission system comprising:
an encoder for encoding the digital symbols at the first location;
an interleaver coupled to the encoder, for interleaving the encoded digital symbols, the interleaver having the adjustable interleaving depth;
a transmission channel for carrying a stream of the interleaved encoded digital symbols from the first location to the second location;
a deinterleaver for deinterleaving the interleaved encoded digital symbols at the second location, the deinterleaver having the adjustable interleaving depth;
a decoder coupled to the deinterleaver, for decoding the encoded digital symbols, so that an errored digital symbol is detectable;
a translator coupled to the decoder, for creating a table of positions of interleaved errored digital symbols in the stream of interleaved encoded symbols; and
a processing unit suitably programmed to:
(i) determine the burst bit error rate according to one of the above stated methods;
(ii) compare the burst bit error rate determined in (i) to a threshold bit error rate;
(iii) if the burst bit error rate determined in (i) is found in (ii) to be higher than the threshold bit error rate, increasing the adjustable interleaving depth of the interleaver and the deinterleaver.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
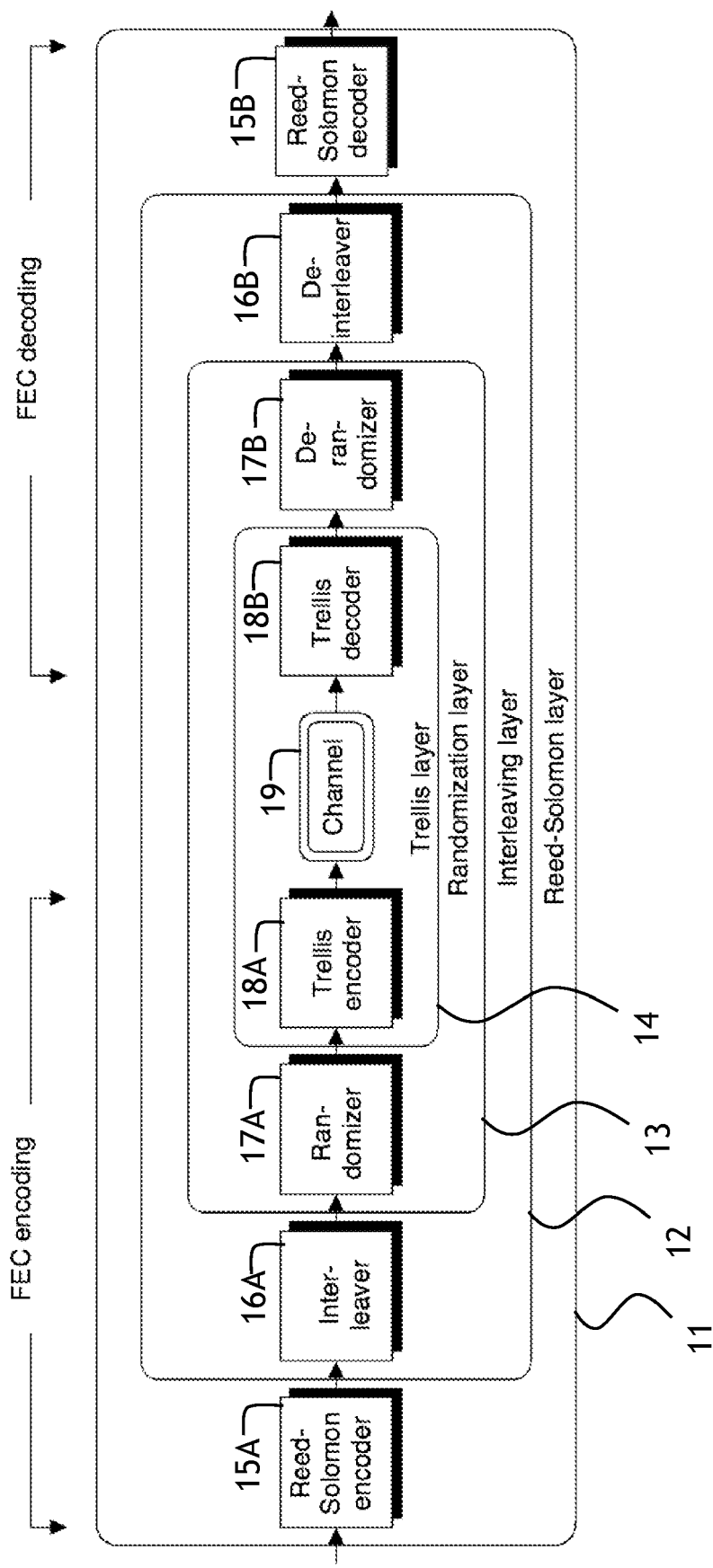
FIG. 1 is a prior-art diagram showing layers of forward error correction (FEC) in the ITU-T J.83 Annex B standard for digital television broadcasting.

Turning to FIG. 1, a diagram showing layers of processing in the forward error correction (FEC) enabled International Telecommunication Union (ITU) data format for digital data broadcasting over a community antennal television (CATV) cable plant is shown. This data format conforms to ITU-T J.83 Annex B standard and is used in an exemplary embodiment of the present invention. Four processing layers are used: a Reed-Solomon (RS) layer 11, an interleaving layer 12, a randomization layer 13, and a trellis layer 14. In the RS layer 11, an incoming stream of symbols is broken down into blocks of 122 7-bit symbols, and encoded by a RS encoder 15A using a RS encoding algorithm into a block having 128 7-bit symbols, so that up to 6 symbol errors per block are detectable, and up to 3 symbol errors per block are correctable upon RS decoding by a RS decoder 15B. In the interleaving layer 12, the encoded symbols corresponding to adjacent blocks of 128 encoded symbols are interleaved, or shuffled, by an interleaver 16A, so that symbol errors due to a burst of noise impacting two or more neighboring symbols are spread over two or more RS blocks of 128 encoded symbols. As a result, an errored symbol correction is possible even in the presence of the burst noise, after the data stream is de-interleaved by a deinterleaver 16B. Further, a randomizer 17A of the randomization layer 13 randomizes the data according to a pre-defined algorithm, to allow effective demodulator synchronization. A de-randomizer 17B de-randomizes the data. Finally, the trellis layer 14 allows introduction of data redundancy to improve the threshold signal-to-noise ratio (SNR) by increasing symbol constellation, or number of bits per symbol, without increasing the symbol rate. As such, it is more properly termed "trellis coded modulation". A trellis encoder 18A encodes the data that are carried by a channel 19 to a trellis decoder 18B that decodes the data to the original bits per symbol.

Figure 2:
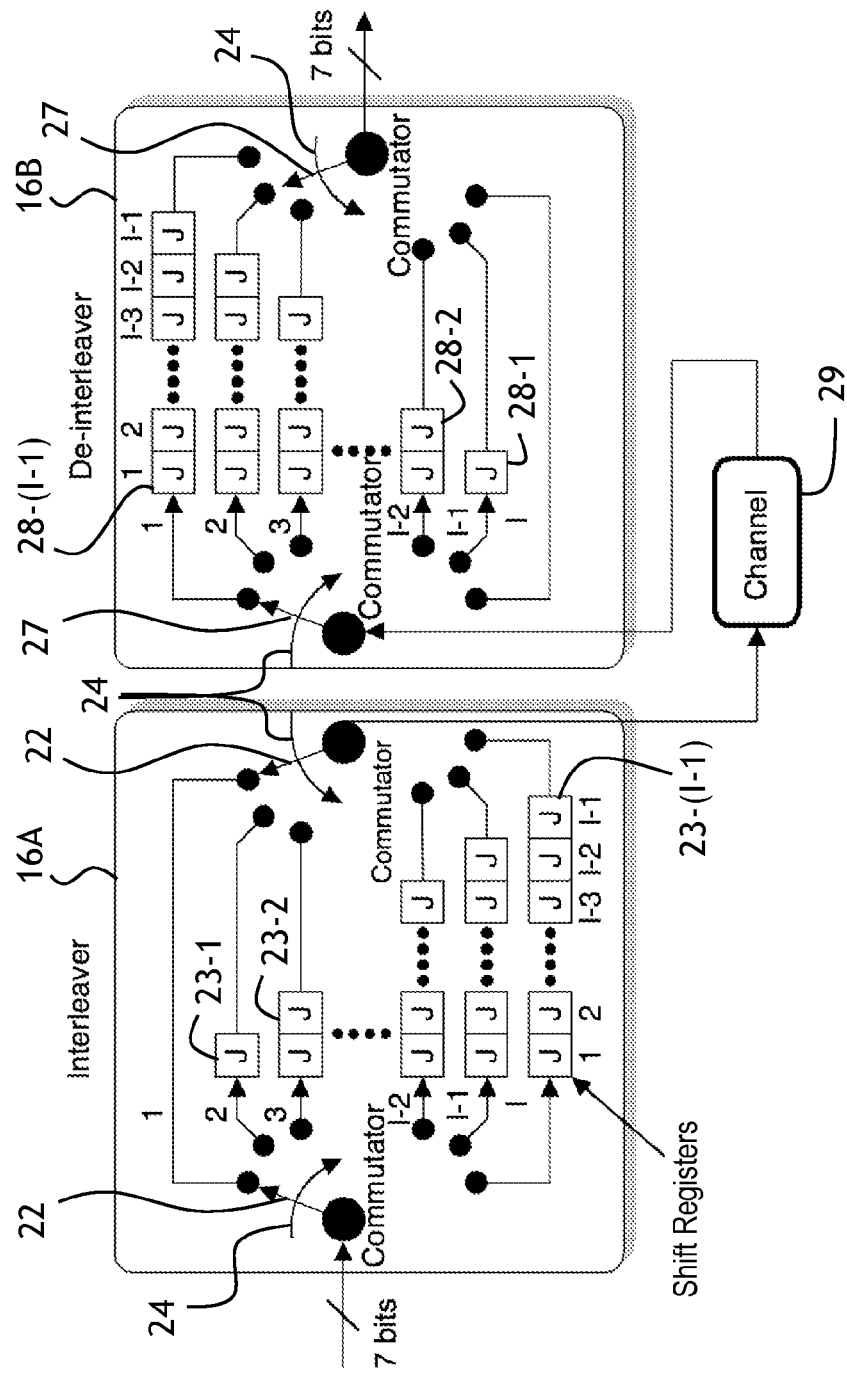
FIG. 2 is a prior-art functional diagram of convolutional interleaving and deinterleaving.

Turning now to FIG. 2, a convolutional interleaving and de-interleaving is illustrated by means of a functional diagram of the interleaver 16A and the de-interleaver 16B connected by a channel 29 symbolizing the randomizing and the trellis layers 13 and 14 of FIG. 1. The interleaver 16A has two commutators 22 and (I−1) shift registers 23-1 to 23-(I−1) having register length progressively increasing from J symbols to (I−1)*J symbols, connected as shown, wherein I and J are integer parameters. The de-interleaver 16B has two commutators 27 and (I−1) one-symbol shift registers 28-1 to 28-(I−1) having register length progressively increasing from J symbols to (I−1)*J symbols connected in a reverse fashion to the connections of the interleaver 16A.

At the start of an FEC frame having 60 RS blocks, positions of the interleaving commutators 22 are initialized to the topmost branch #1 as shown in FIG. 2. The interleaving commutators 22 increment positions at the RS symbol frequency as illustrated by arrows 24, with a single symbol output from each position. In the convolutional interleaver 16A, the RS code symbols are sequentially shifted into the bank of I shift registers, the width of each register being 7 bits to match the RS symbol size. Each successive register 23-2, . . . , 23-I has J symbols more storage than a preceding register. The first interleaver path has zero delay, the second has a J symbol delay, the third 2*J symbol delay, and so on, up to the $I^{th}$ path, which has (I−1)*J symbol delay. This is reversed for the de-interleaver 16B such that the net delay of each RS symbol is the same after passing the RS symbol through a serial combination of the interleaver 16A and the de-interleaver 16B. Burst noise in the channel 29 causes a series of errored symbols. These are spread over many RS blocks by the de-interleaver such that the resultant symbol errors per RS block are within the range of the RS decoder correction capability. Note that burst noise is defined herein as any noise that corrupts two or more symbols within a specified time interval, e.g. 1 microsecond.

A principle of burst error detection in a CATV broadcasting system of the present invention, employing the FEC layers 11 to 14 of FIG. 1 and the convolutional interleaver—de-interleaver pair 16A and 16B of FIG. 2, will now be illustrated.

Figure 3:
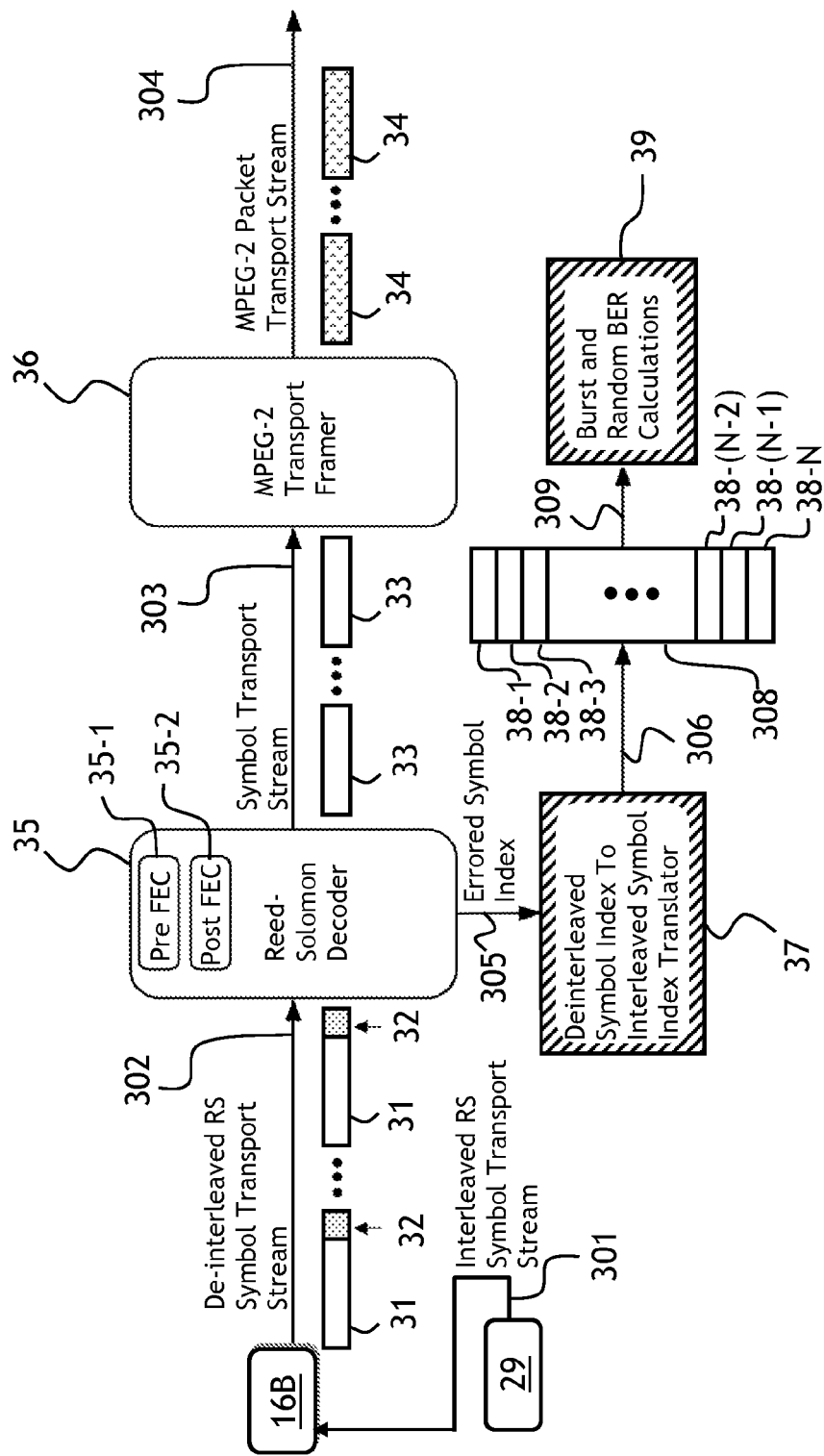
FIG. 3 is a functional diagram of a digital data stream processing according to the present invention.

Referring to FIG. 3, a functional diagram of a digital data stream processing according to the present invention is shown. In operation, an interleaved RS symbol transport stream 301 carried by the channel 29 is de-interleaved by the de-interleaver 16B to form a de-interleaved RS symbol transport stream 302 having RS blocks 31 of 128 7-bit symbols, out of which six symbols 32 are RS "parity symbols". The de-interleaved RS symbol transport stream 302 is decoded by a RS decoder 35 that produces, at its output, a decoded symbol transport stream 303 having decoded blocks 33 of symbols. Then, a MPEG-2 transport framer 36 transforms the decoded symbol blocks 33 into a transport stream 304 of useful MPEG-2 packets 34.

The burst error detection processing is implemented as follows. The RS decoder 35 produces an index 305 indicating a position of a deinterleaved errored symbol within the RS block 31. The RS decoder 35 also labels the symbol error as either correctable or non-correctable. A translator 37 translates the deinterleaved errored symbol index 305 into an interleaved errored symbol index 306 based on the information about the interleaving algorithm employed. The interleaved errored symbol index 306 indicates a position of the errored symbol in the transport stream 301 of interleaved encoded symbols. The translator 37 builds a table 308 of interleaved errored symbol indices 38-1, 38-2, . . . , 38-N sorted incrementally according to the index value, wherein N is the total number of errored symbols. In other words, table 308 is a table of positions of errored symbols in the stream 301 of interleaved encoded symbols. A link 309 inputs the interleaved errored symbol index table 308 to a burst and random BER calculation unit 39 that analyzes the interleaved errored symbol index table 308 to calculate the burst BER. Burst BER is defined herein as a BER due to burst noise that corrupts two or more symbols within a specified time interval, e.g. 1 microsecond. Accordingly, random BER is defined as a BER due to a random noise that can only corrupt no more than one symbol within the specified time interval.

In one embodiment of the invention, the translator 37 operates by re-interleaving the deinterleaved symbol stream 302 according to the known algorithm of interleaving by the interleaver 16A. To obtain the algorithm information automatically, the translator 37 preferably analyzes an FEC frame sync trailer, not shown in FIG. 3. The FEC frame sync trailer has the interleaving depth information at a location conforming to the ITU-T J.83 Annex B standard, which is incorporated herein by reference. Preferably, the burst error detection is sensitive to whether the error is correctable or not correctable; accordingly, the burst BER calculations produce a "correctable" and a "non-correctable" burst BER. With regard to correctable and non-correctable errors, the RS decoder 35 has two stages: an error detector 35-1 and an error corrector 35-2. The prior-art pre-FEC BER calculation is performed by counting all of the errored symbols detected by the error detector 35-1 while the prior-art post-FEC BER is calculated by counting only the "non-correctable" errored symbols that have not been corrected by the error corrector 35-2. The present invention makes it possible to determine the pre-FEC burst BER due to all errored symbols, correctable and uncorrectable, detected by the error detector 35-1. Advantageously, the present invention also allows post-FEC "non-correctable burst BER" determination using only uncorrectable errored symbols. The pre- and post-FEC random BER, including non-correctable random BER, can also be calculated. More details are provided below.

Figure 4:
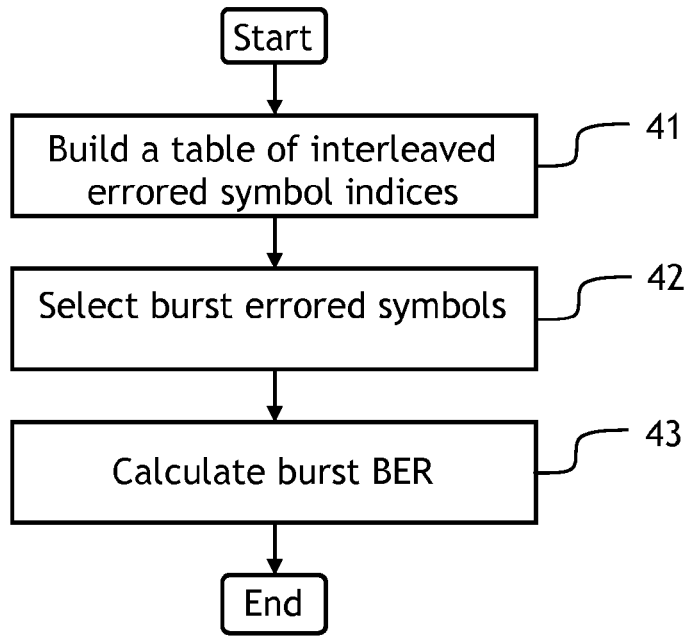
FIG. 4 is a flow chart of a method of calculating burst bit error rate (BER) according to the present invention.

Turning now to FIG. 4, a general flow chart of a method of calculating a burst BER according to the present invention is shown. At a step 41, errored symbols are detected by the RS decoder 35 and the interleaved errored symbol index table 308 is built by the translator 37. At a step 42, burst errored symbols are selected by the burst and random BER calculation unit 39. Finally, at a step 43, burst BER is calculated by the burst and random BER calculation unit 39.

Figure 5A:
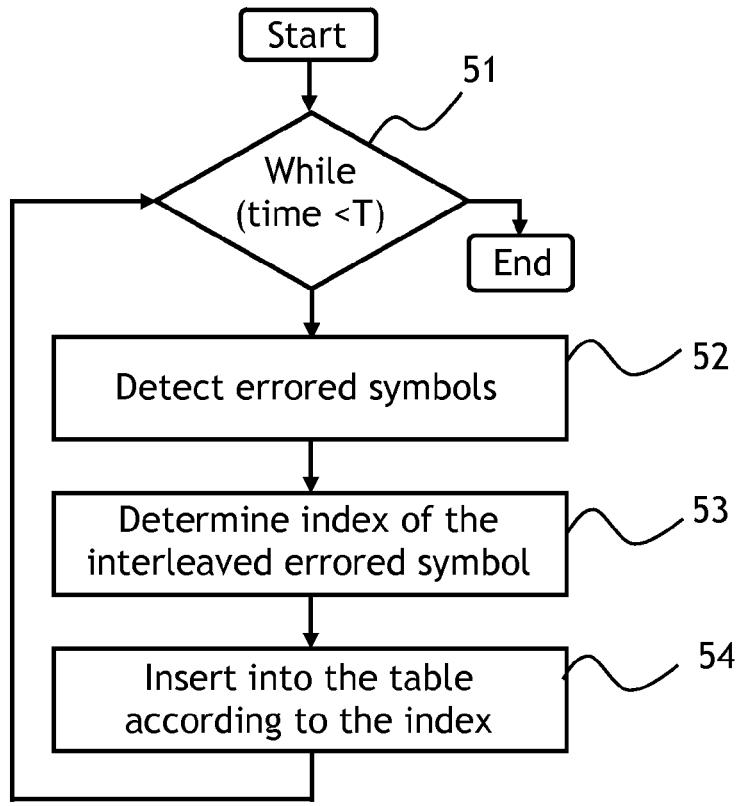
FIGS. 5A to 5C are flow charts of the first step of the flow chart of FIG. 4.
Figures 5B, 5C:
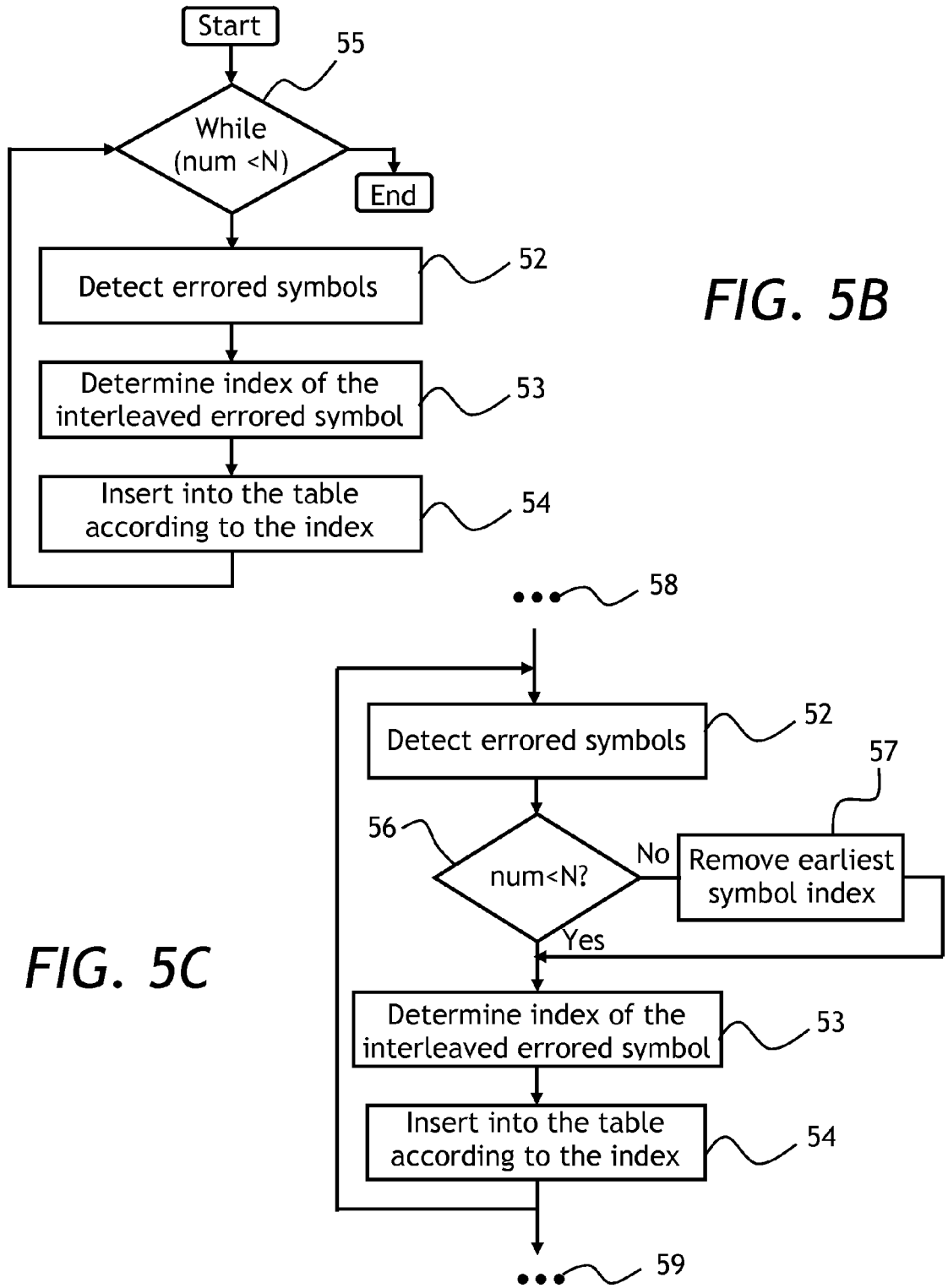

The generalized steps 41 to 43 of FIG. 4 will now be considered in more detail. Referring to FIGS. 5A to 5C, flow charts of three embodiments of the step 41 are presented. In FIGS. 5A to 5C, the procedure includes a step 52 of detecting errored symbols by the RS decoder 35; a step 53 of determining index of the interleaved errored symbol 53; and a step 54 of inserting the determined index into the interleaved errored symbol index table 308 according to the index value, e.g. incrementally. In FIG. 5A, a "while (time<T)" block 51 is used to repeat the procedure for a given period of time T. In FIG. 5B, a "while (num<N)" block 55 is used to repeat the procedure until number of detected errors reaches a predefined number N. In FIG. 5C, the procedure is run as a part of a more general control procedure between points 58 and 59 to create a "running" version of the table 308 of indices of interleaved errored symbols, wherein upon filling N positions in the table 308 as decided by a decision block 56. To create a room for the index of the latest error detected, the earliest symbol index is removed at a step 57. The indices indicate positions of errored symbols in the stream 301 of interleaved encoded symbols.

Figure 6A:
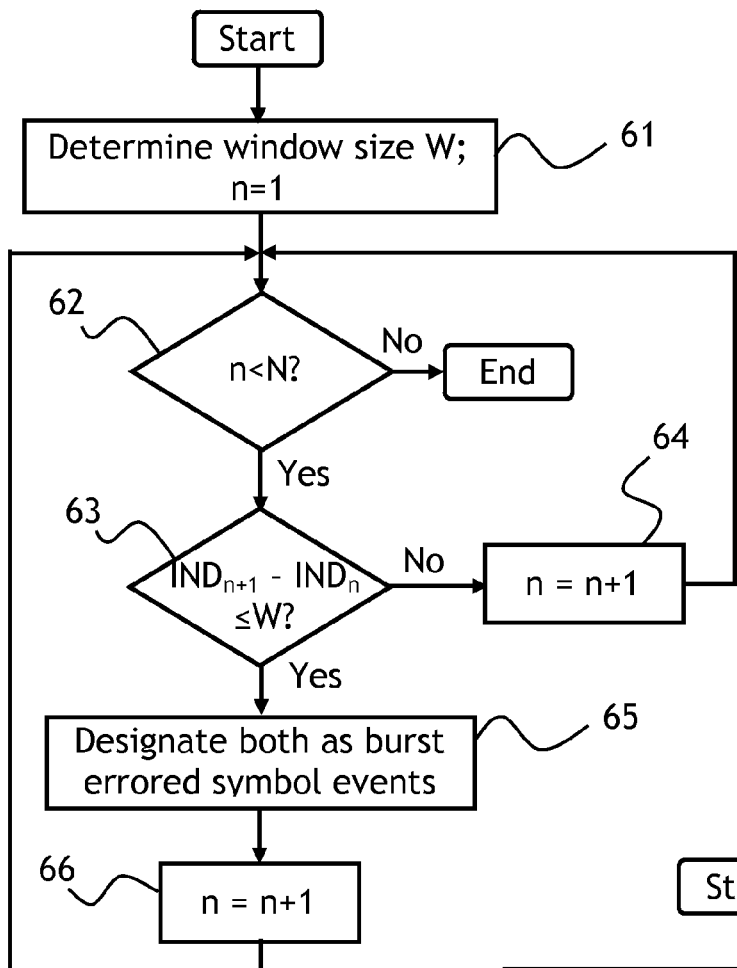
FIGS. 6A and 6B are flow charts of the second step of the flow chart of FIG. 4.
Figure 6B:
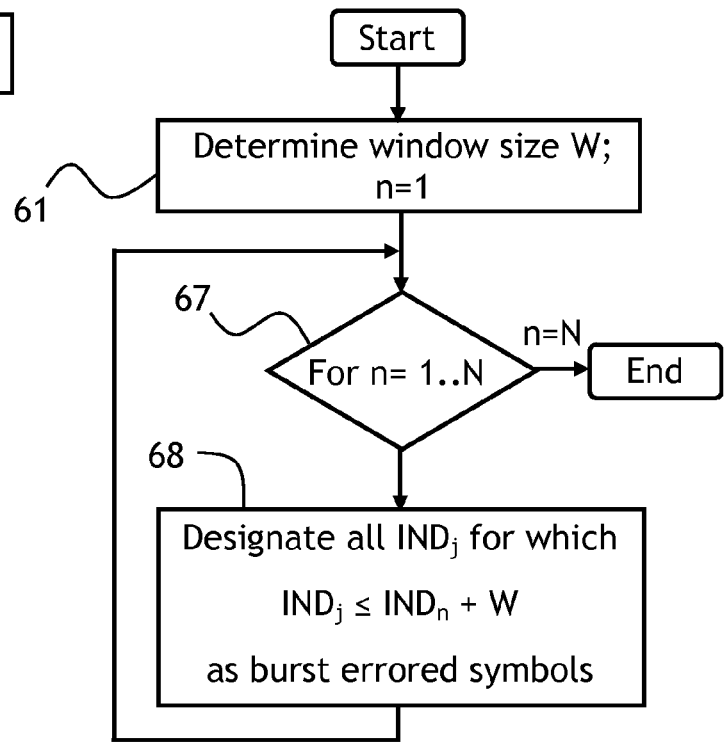

Referring now to FIGS. 6A and 6B, flow charts of two embodiments of the step 42 are presented. For both embodiments, the main idea is to provide a window sliding across the interleaved errored symbol index table 308 and designate errored symbol indices within the window as burst symbol errors. In FIG. 6A, at a step 61, a size W of the window, in the units of index counts, is determined, and a counter n is reset to 1. The window width W is a threshold symbol-to-symbol distance, below which the errored symbols are considered to be caused by burst noise. At a step 62, a check is performed if n<N, wherein N is the maximum size of the interleaved errored symbol index table 308. if n<N, then at a step 63, a check is performed if a difference $IND_{n+1} - IND_n$ between index values of $n^{th}$ and $(n+1)^{th}$ indices is smaller or equal to the window size W. If $IND_{n+1} - IND_n \leq W$, then both $n^{th}$ and $(n+1)^{th}$ errored symbol events are designated as burst errored symbol events at a step 65, the counter n is incremented at a step 66, and the procedure repeated as shown. If $IND_{n+1} - IND_n > W$, then the counter n is incremented at a step 64, and the procedure repeated as shown. In FIG. 6B, at the step 61, the size W of the window, in the units of index counts, is determined, and the counter n is reset to 1. Then, at a step 67, the following is repeated for each of the N elements of the interleaved errored symbol index table 308: all indices $IND_j$ for which $IND_j \leq IND_n + W$, are designated as burst error symbol events. This repeating step is denoted at 68.

Figure 7:
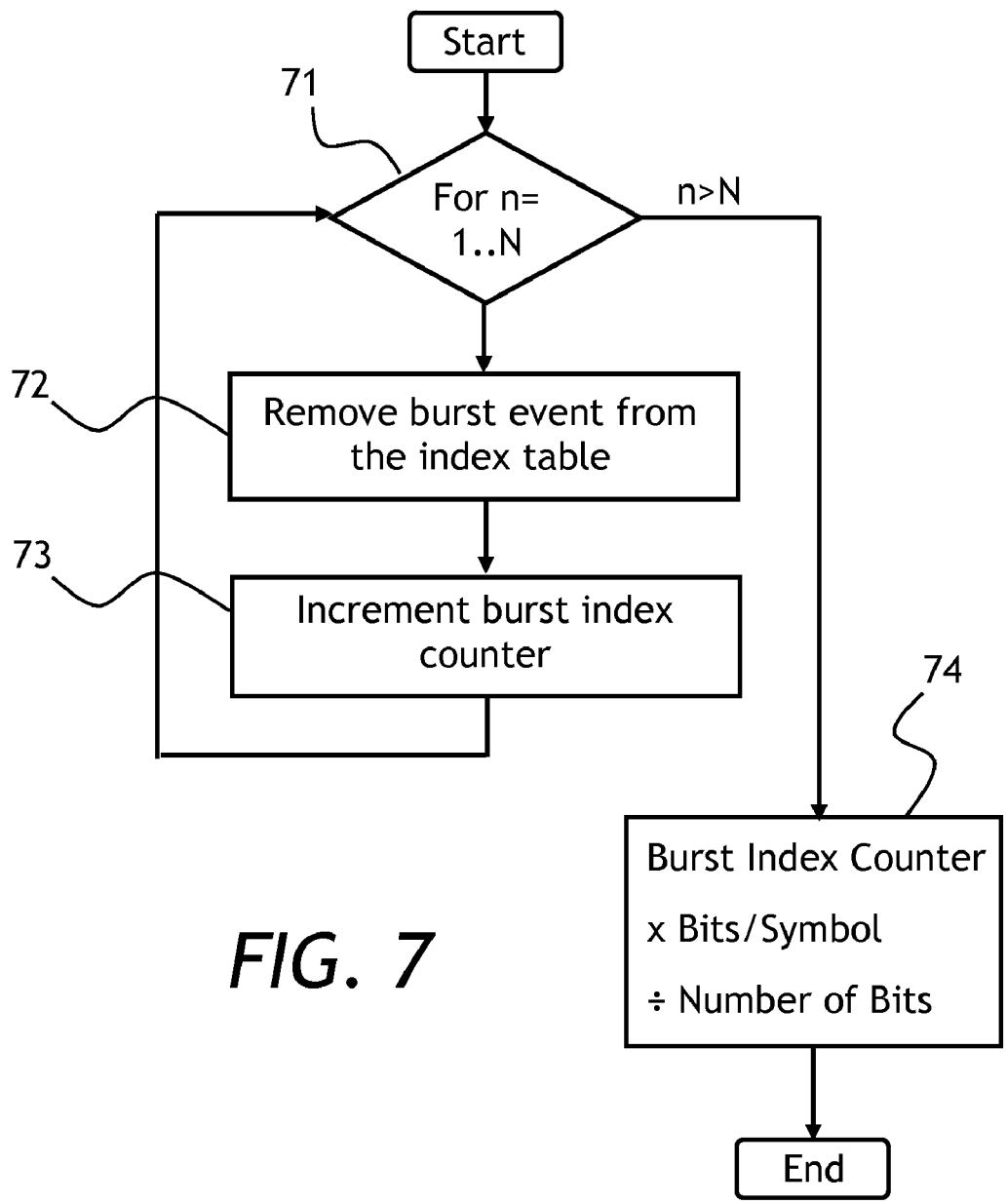
FIG. 7 is a flow chart of the third step of the flow chart of FIG. 4.

Referring to FIG. 7, a flow chart of the step 43 of calculating burst BER by the calculation unit 39 is presented. For each value of the counter n between 1 and N, as is symbolized by a repetition block 71, a check is performed whether the event is a burst errored symbol event, and if it is, then at a step 72, the index corresponding to that event is removed from the interleaved errored symbol index table 308, and at a step 73, a burst index counter is incremented. When n exceeds N, the procedure is no longer repeated, and the burst BER is calculated at a step 74 by multiplying the burst index counter by number of bits per symbol, e.g. 7 bits per symbol, and dividing by the total number of bits transmitted.

In one embodiment of the invention, the steps 41 to 43, as described by FIGS. 4, 5A to 5C, 6A to 6B, and 7, are performed only for non-correctable burst errored symbols, so as to calculate non-correctable burst BER. Further, the steps 72 to 74 of FIG. 7 can be modified to calculate random BER, including non-correctable random BER. The random BER is calculated by only counting non-burst errored symbol events, for which $IND_{n+1} - IND_n > W$.

Figure 8:
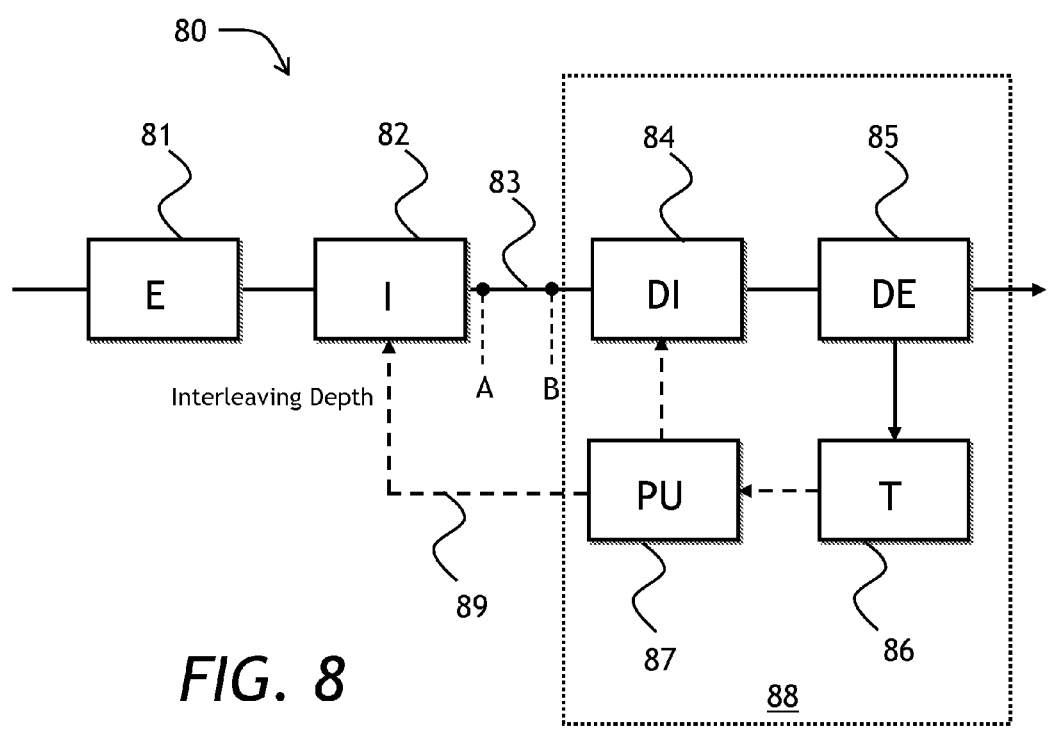
FIG. 8 is a block diagram of a transmission system according to the present invention.

Referring now to FIG. 8, a block diagram of a transmission system 80 of the present invention, for transmitting digital symbols between a location A and a location B, is shown. The transmission system 80 has an encoder 81 for encoding digital symbols, an interleaver 82 for interleaving the encoded digital symbols, a transmission channel 83 for carrying a stream of the interleaved encoded symbols from location A to location B, a deinterleaver 84 matched with the interleaver 82, for deinterleaving the interleaved encoded symbols at location B, a decoder 85 matched with the encoder 81, for decoding the encoded symbols, so that an errored symbol is detectable, a translator 86 for creating a table of indices indicating positions of errored symbols in the stream 301 of interleaved encoded symbols, and a processing unit 87 for controlling an interleaving depth of the interleaver 82 and the de-interleaver 84. The de-interleaver 84, the decoder 85, the translator 86, and the processing unit 87 are a part of a receiver 88.

In operation, encoded interleaved symbols propagate in the transmission channel 83 that is influenced by burst noise, whereby some of the symbols become corrupted, or errored. The interleaver 84 de-interleaves the symbols, and the decoder 85 decodes the symbols, whereby location of the errored symbols in the de-interleaved data stream becomes known. The translator 86 builds a table of indices of the errored symbols detected by the decoder 85, indicating positions of the errored symbols in the interleaved data stream, using methods illustrated by FIGS. 5A to 5C. The table of indices of the errored symbols corresponds to the table 308 of positions of errored symbols in the stream 301 of interleaved encoded symbols of FIG. 3. The processing unit 87 calculates burst errored symbol BER according to methods illustrated in FIGS. 6A, 6B, and 7. Further, the processing unit 87 adjusts the interleaving depth of the de-interleaver 84 and the interleaver 82. The latter is adjusted by means of an auxiliary link 89, which can be a permanent physical link or a virtual link symbolizing a periodic calibration of the transmission system 80, for example.

The interleaving depth adjustment is performed as follows. First, the calculated burst errored symbol BER is compared to a threshold BER; and second, if the burst BER is found to be higher than the threshold BER, the interleaving depth of the interleaver 82 and the deinterleaver 84 is increased. In this way, if burst BER, that is, a BER increase due to the burst noise, is higher than the pre-determined threshold value, the interleaving depth is increased, so as to reduce the impact of burst noise on the BER of the transmission system 80.

Various modifications of the present invention can be envisioned by those skilled in the art. For example, the translator 37 can have an interleaver identical to the interleaver 16A, for re-interleaving the errored symbols, or, alternatively, the translator 17 can have a device that uses the interleaving information to calculate the interleaved errored symbol index. It is to be understood that all such modifications are a part of the invention.

What is claimed is:

1. A method for determining whether errored symbols of a received interleaved digital signal stream are due to burst noise, the method comprising:
   (a) using a deinterleaver to deinterleave the interleaved digital signal stream;
   (b) using a decoder to detect first and second symbol errors in the digital signal stream deinterleaved in step (a), wherein the first and the second symbol errors correspond to first and second errored symbols, respectively; and
   (c) using a processing unit to determine whether the first and the second errored symbols are due to burst noise, by comparing a separation between the first and the second errored symbols in the interleaved digital signal stream to a pre-determined threshold value.

2. A method of claim 1, wherein the interleaved digital signal stream is a digital data transport stream in a communication link.

3. A method of claim 2, wherein the digital signal stream is a quadrature amplitude modulated signal stream.

4. A method of claim 1, wherein the interleaver is a convolutional deinterleaver, wherein in step (a), the deinterleaving is performed by the convolutional deinterleaver.

5. A method of claim 1, wherein the interleaved digital signal is encoded using Reed-Solomon encoding, and wherein the decoder is a Reed-Solomon decoder.

6. A method of claim 5, wherein in step (b), at least one of the first and the second symbol error is labeled as either correctable or non-correctable by the decoder, the method further comprising:
(d) using the processing unit to determine whether the burst noise has caused a non-correctable error, by checking if at least one of the first and the second symbol errors is labeled as non-correctable.

7. A method of claim 1, further comprising:
(d) using the processing unit to determine a total number of the errored symbols due to the burst noise, wherein the errored symbol separation is smaller than the predetermined threshold value;
(e) using the processing unit to determine a total number of bits received; and
(f) using the processing unit to determine a bit error rate due to the burst noise by multiplying the total number of the errored symbols due to the burst noise by a number of bits per symbol and dividing by the total number of the bits received.

8. A method of claim 7, wherein step (d) comprises:
(d1) creating a table of incrementing indices indicating positions of the errored symbols in the interleaved digital signal stream;
(d2) applying a sliding window to the table of incrementing indices, the window having a width equal to the pre-determined threshold value; and
(d3) designating the errored symbols having indices within the sliding window as the errored symbols due to the burst noise.

9. A method of claim 1, wherein in step (b), at least one of the first and the second symbol error is labeled as either correctable or non-correctable, the method further comprising:
(d) using the processing unit to determine whether the burst noise has caused a non-correctable error, by checking if at least one of the first and the second symbol errors is labeled as non-correctable;
(e) using the processing unit to determine a total number of the non-correctable errored symbols due to the burst noise, wherein the errored symbol separation is smaller than the pre-determined threshold value;
(f) using the processing unit to determine a total number of bits received; and
(g) using the processing unit to determine a non-correctable bit error rate due to the burst noise by multiplying the total number of the non-correctable errored symbols due to the burst noise by a number of bits per symbol and dividing by the total number of the bits received.

10. A method of claim 1, further comprising:
(d) using the processing unit to determine a total number of the errored symbols due to random noise, wherein the errored symbol separation is equal to or larger than the pre-determined threshold value;
(e) using the processing unit to determine a total number of bits received; and
(f) using the processing unit to determine a bit error rate due to the random noise by multiplying the total number of the errored symbols due to the random noise by a number of bits per symbol and dividing by the total number of bits received.

11. A method for determining a burst bit error rate in a digital transmission link for transmitting a stream of interleaved encoded symbols, the method comprising:
(a) using a deinterleaver to deinterleave the stream of interleaved encoded symbols;
(b) using a decoder to decode the deinterleaved stream of symbols, so as to detect errored symbols;
(c) using a translator to create a table of positions of the errored symbols in the stream of interleaved encoded symbols;
(d) using a processing unit to select, based on the table of positions created in step (c), burst errored symbols, which are closer to each other in the stream of interleaved encoded symbols than a pre-defined threshold symbol-to-symbol distance;
(e) using the processing unit to calculate a total number of the burst errored symbols; and
(f) using the processing unit to determine the burst bit error rate based on the total number of the burst errored symbols calculated in step (e).

12. A method of claim 11, wherein step (c) includes re-interleaving the errored symbols.

13. A method of claim 11, wherein step (b) includes:
(b1) Reed-Solomon decoding, wherein the detected errored symbols are labeled as either correctable or non-correctable.

14. A method of claim 11, wherein step (d) includes selecting only non-correctable errored symbols, and wherein step (f) comprises determining a non-correctable burst bit error rate.

15. A method of claim 11, wherein step (f) includes multiplying the total number of the burst errored symbols by a number of bits per symbol to obtain a product, and by dividing the product by a total number of bits transmitted.

16. A receiver for determining a burst bit error rate in a digital transmission link for transmitting a stream of interleaved encoded symbols, the receiver comprising:
a deinterleaver for deinterleaving the interleaved encoded symbols;
a decoder coupled to the deinterleaver, for decoding the deinterleaved encoded symbols, so that an errored symbol is detectable;
a translator coupled to the decoder, for creating a table of positions of errored symbols in the stream of interleaved encoded symbols; and
a processing unit suitably programmed to:
(i) select, based on the table of positions created by the translator, burst errored symbols, which are closer to each other in the stream of interleaved encoded symbols than a pre-defined threshold symbol-to-symbol distance;
(ii) calculate a total number of the burst errored symbols; and
(iii) determine the burst error rate based on the total number of the burst errored symbols calculated in (i).

17. A transmission system for transmitting symbols between first and second locations, wherein the transmission system has an adjustable interleaving depth, the transmission system comprising:
an encoder for encoding the symbols at the first location;
a first interleaver coupled to the encoder, for interleaving the encoded symbols, the first interleaver having the adjustable interleaving depth;
a transmission channel for carrying a stream of the interleaved encoded symbols from the first location to the second location;
a deinterleaver for deinterleaving the interleaved encoded symbols at the second location, the deinterleaver having the adjustable interleaving depth;
a decoder coupled to the deinterleaver, for decoding the deinterleaved encoded symbols, so that an errored symbol is detectable;

a translator coupled to the decoder, for creating a table of positions of errored symbols in the stream of interleaved encoded symbols; and a processing unit suitably programmed to:

(i) select, based on the table of positions created by the translator, burst errored symbols, which are closer to each other in the stream of interleaved encoded symbols than a pre-defined threshold symbol-to-symbol distance;

(ii) calculate a total number of the burst errored symbols;

(iii) determine the burst error rate based on the total number of the burst errored symbols calculated in (i);

(iv) compare the burst bit error rate determined in (iii) to a threshold bit error rate; and (v) if the burst bit error rate determined in (iii) is found in (iv) to be higher than the threshold bit error rate, increase the adjustable interleaving depth of the first interleaver and the deinterleaver.

18. A transmission system of claim 17, wherein the translator has a second interleaver having the adjustable interleaving depth, for re-interleaving the deinterleaved encoded symbols, so as to create the table of positions of errored symbols in the stream of interleaved encoded symbols.

19. A transmission system of claim 17, wherein the encoder is a Reed-Solomon encoder, and the decoder is a Reed-Solomon decoder.

20. A transmission system of claim 17, wherein the first interleaver is a convolutional interleaver, and the deinterleaver is a convolutional deinterleaver.

* * * * *